United States Patent [19]
Lawton

[11] Patent Number: 5,124,670
[45] Date of Patent: Jun. 23, 1992

[54] FREQUENCY SYNTHESIZERS WITH FRACTIONAL DIVISION

[76] Inventor: Rodney J. Lawton, 18 Washpool, Shaw, Swindon, Wilts SN5 9PN, Great Britain

[21] Appl. No.: 613,568
[22] PCT Filed: Apr. 2, 1990
[86] PCT No.: PCT/GB90/00491
  § 371 Date: Jan. 24, 1991
  § 102(e) Date: Jan. 24, 1991
[87] PCT Pub. No.: WO90/12458
  PCT Pub. Date: Oct. 18, 1990

[30] Foreign Application Priority Data

Mar. 31, 1989 [GB] United Kingdom ............... 8907316

[51] Int. Cl.$^5$ ............................................. H03L 7/00
[52] U.S. Cl. ............................................ 331/10; 331/25
[58] Field of Search ................... 331/1 A, 10, 18, 25

[56] References Cited

U.S. PATENT DOCUMENTS 4,758,802  7/1988  Jackson ................................. 331/10
4,800,342  1/1989  Jackson ................................. 331/10

*Primary Examiner*—Robert J. Pascal
*Attorney, Agent, or Firm*—Fleit, Jacobson, Cohn, Price, Holman & Stern

[57] ABSTRACT

A fractional-N synthesizer including a phase locked loop comprising: a voltage controlled oscillator (4) providing a loop output signal, the output signal being coupled via an N variable divider (6) to a first input of a phase or frequency detector (8); a reference frequency source coupled to a second input of the phase or frequency detector (8), the detector providing at an output a control signal, in dependence upon a comparision between the signals applied to the first and second inputs, for application to a control input of the voltage controlled oscillator (4); and means for setting the division ratio (N) of the variable divider (6) in response to a frequency data word, including interpolator means (50) for periodically varying at least the LSB of the frequency data word, the interpolator means (50) comprising an input for receiving said LSB, a combiner means (70, 80) for comparing the LSB with a feedback signal, and a quantizer circuit (72, 84) and a filter circuit (74, 82) providing a predetermined delay or integration function, such circuits being coupled to said combiner means (70, 80) for providing said feedback signal and a ratio setting signal to the variable divider (6).

10 Claims, 5 Drawing Sheets

FREQUENCY SYNTHESIZERS WITH FRACTIONAL DIVISION

FIELD OF THE INVENTION

The present invention relates to fractional 'N' synthesisers.

BACKGROUND ART

Fractional 'N' synthesisers are commonly used in frequency synthesisers of the type used to generate a local oscillator signal for a receiver in order to generate an intermediate frequency signal when the local oscillator signal is mixed with an incoming signal. A conventional frequency synthesiser is shown in FIG. 1 as comprising a phase lock loop 2 including a voltage controlled oscillator 4 providing a synthesiser output frequency $F_0$, this frequency being divided in a variable divider 6 by a factor a and the divided frequency $F_0/a$ being compared in phase with a reference frequency $F_{ref}$ in a phase detector 8, the output of the phase detector being applied by a loop filter 10 to control the frequency of the voltage controlled oscillator 4. The variable divider is controlled by an M bit register 12 which receives a programming frequency word, the variable divider 6 determining the numeric value of the division ratio a. Thus it is possible by adjusting the value of the frequency word to vary the division ratio and hence alter the synthesiser output frequency $F_0$ in order to tune a receiver to the various received channels. A problem with this type of frequency synthesiser is that the minimum "step" to which the synthesiser may be tuned is $F_{ref}$ since $dF_0 = F_{ref}(a - (a-1)) = F_{ref}$. In the context of frequency hopping techniques, the hopping rate is dictated by $F_{ref}$ together with the loop bandwidth. FIG. 2 shows a schematic form of the circuit of FIG. 1.

In order to increase the resolution of a frequency synthesiser so that smaller tuning steps can be accommodated, it is known to manipulate the division ratio; such a synthesiser is termed a fractional 'N' synthesiser, since it resolves to fractions of an 'N' bit word. Early forms of this technique are described in U.S. Pat. No. 3,555,446 and U.S. Pat. No. 3,582,810. More modern forms are described in UK-A-1447418, U.S. Pat. No. 3,976,945 and U.S. Pat. No. 3,928,813. Such forms are shown in general form in FIG. 3 where similar parts to those of FIG. 1 have the same reference numerals.

A digital accumulator 20 is supplied with an input which represents the fractional frequency instruction for the synthesiser while the divider is fed with the non-fractional part (e.g. 40 kHz multiple) of the frequency (i.e. $N \times 40$ kHz). The system obtains fine frequency control by changing the division ratio of the divider 6 between N and N+1 in response to the accumulator output. It can be seen that if the relative number of divide by N and divide by N+1 cycles is manipulated over a period of time any average frequency between $N \times 40$ kHz and $(N+1) \times 40$ kHz can be achieved. The state of the N/N+1 control line 22 is set by the digital accumulator overflow. The rate at which the accumulator overflows is directly proportional to the ratio of the fractional component to the phase detector rate.

The manipulation of the divider radio inevitably generates phase perturbations. The nature of the phase perturbations is however predictable and turns out to be directly proportional to the residual content of the digital accumulator output. The residual phase jitter can be cancelled to a reasonable extent by converting the accumulator output to an analogue signal and applying it to a phase modulator 24. There is a limit to how accurately this cancellation can be achieved getting a cancellation of better than 1% can be troublesome and often good analogue cancellation results in the phase detector being operated significantly below its maximum potential frequency. The size of the analogue correction signal applied to the phase modulator also has to be scaled according to the division ratio (N) to maintain cancellation.

An improved version of fractional-N is disclosed in GB-A-2026268 which uses two accumulators but still requires analog correction in order to achieve good spurious performance and again getting good cancellation the analogue path results in the phase detector being operated at below its optimum frequency.

GB-A-2172759 discloses a frequency synthesiser of the fractional-N type including an interpolator which limit cycles to produce an output bit stream which is added to the LSB of the divider data word.

SUMMARY OF THE INVENTION

It is an object of the present invention to provide a fractional-N synthesiser having improved performance and reduced cost.

The present invention provides a fractional-N synthesiser including a phase locked loop comprising:

a voltage controlled oscillator providing a loop output signal, the output signal being coupled via a+N variable divider to a first input of a phase or frequency detector;

a reference frequency source coupled to a second input of the phase or frequency detector, the detector providing at an output a control signal, in dependence upon a comparison between the signals applied to the first and second inputs, for application to a control input of the voltage controlled oscillator; and means for setting the division ratio (N) of the variable divider in response to a frequency data word, including interpolator means for periodically varying at least one bit of the frequency data word, the interpolator means comprising an input for receiving said one bit, a combiner means for comparing said one bit with a feedback signal, and a quantiser circuit and a filter circuit providing a predetermined delay or integration function, such circuits being coupled to said combiner means for providing said feedback signal and a ratio setting signal to the variable divider.

As preferred, said interpolator receives a K-bit word, and provides a periodically varying M-bit word, where K>M, for setting the division ratio of the variable divider.

In accordance with the invention, the interpolator means serves as the sole means of reducing phase perturbations, since phase perturbations are provided as noise in high frequency regions which have no significant effect on the phase locked loop; no analogue signal is provided to the phase locked loop for compensating for jitter in the output of the phase or frequency detector.

BRIEF DESCRIPTION OF THE DRAWINGS

Preferred embodiments of the invention will now be described with reference to the accompanying drawings, wherein.

DESCRIPTION OF THE PREFERRED EMBODIMENT

Figure 4:
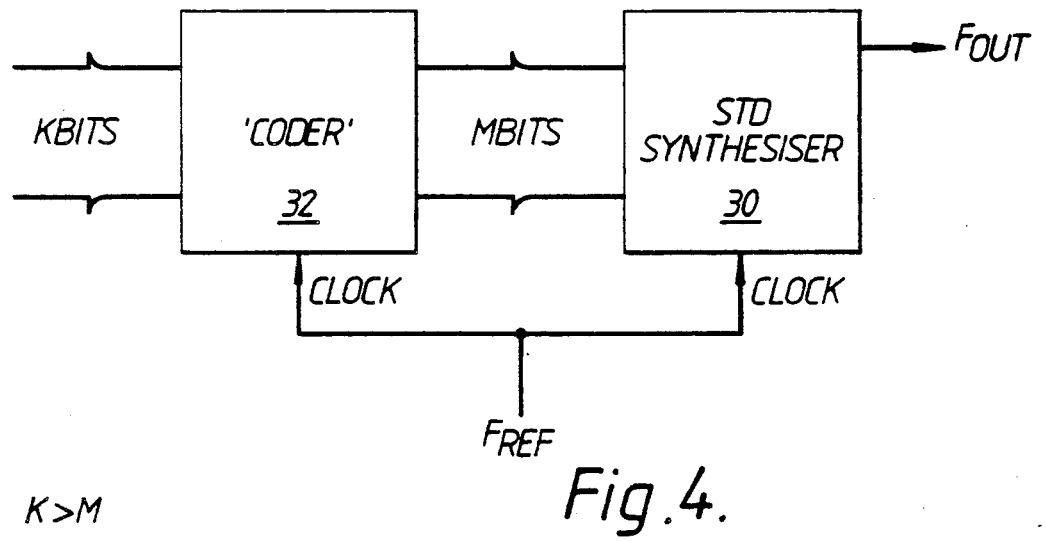
FIG. 4 is a schematic representation of a fractional-N synthesiser in accordance with the invention.

Referring now to the schematic representation of the invention in FIG. 4, interpolation techniques are employed on the frequency word applied to the variable divider of the synthesiser so that a large K bit word is applied to a coder or interpolator which produces an M bit approximation to the K bit work, M being less than K. A standard synthesiser 30 which is of a capacity to receive an M bit word, receives the M bit word from a coder 32. Within each clock cycle of the reference frequency $F_{ref}$, the coder 32 produces a different approximation to the M bit word so that the M bit word varies in a time sequential manner in order to produce the required resolution. The effective resolution of the synthesiser is increased to $F_{ref}/2^{(K-M)}$.

Figure 5:
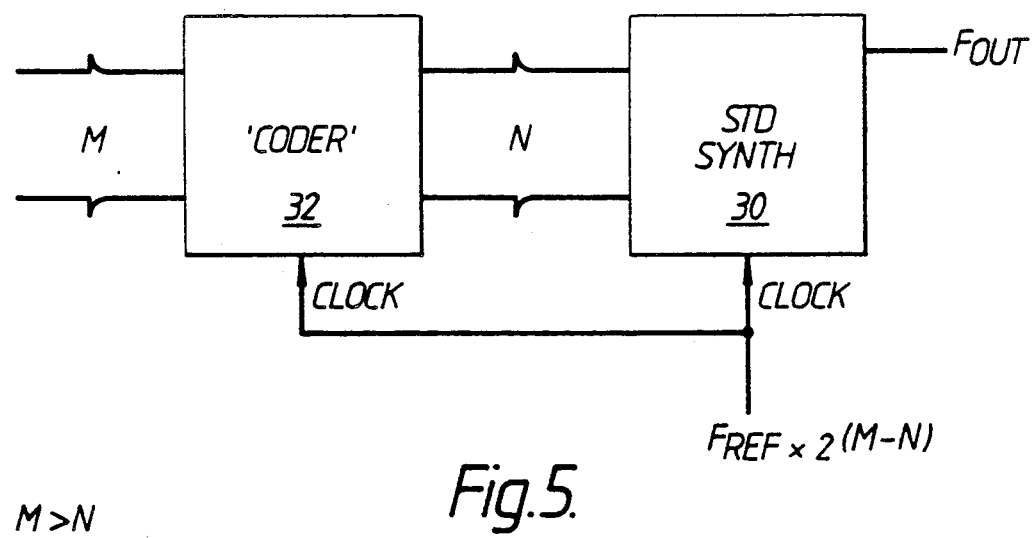
FIG. 5 is a schematic view of an alternative scheme for a synthesiser in accordance with the invention.

In an alternative arrangement shown in FIG. 5, the reference frequency is increased by a factor of $2^{(K-M)}$. The advantage of the arrangement in FIG. 5 is that although the resolution of the synthesiser remains the same, since the reference frequency is increased, the hopping rate for frequency hopping techniques is similarly increased.

Figure 1:
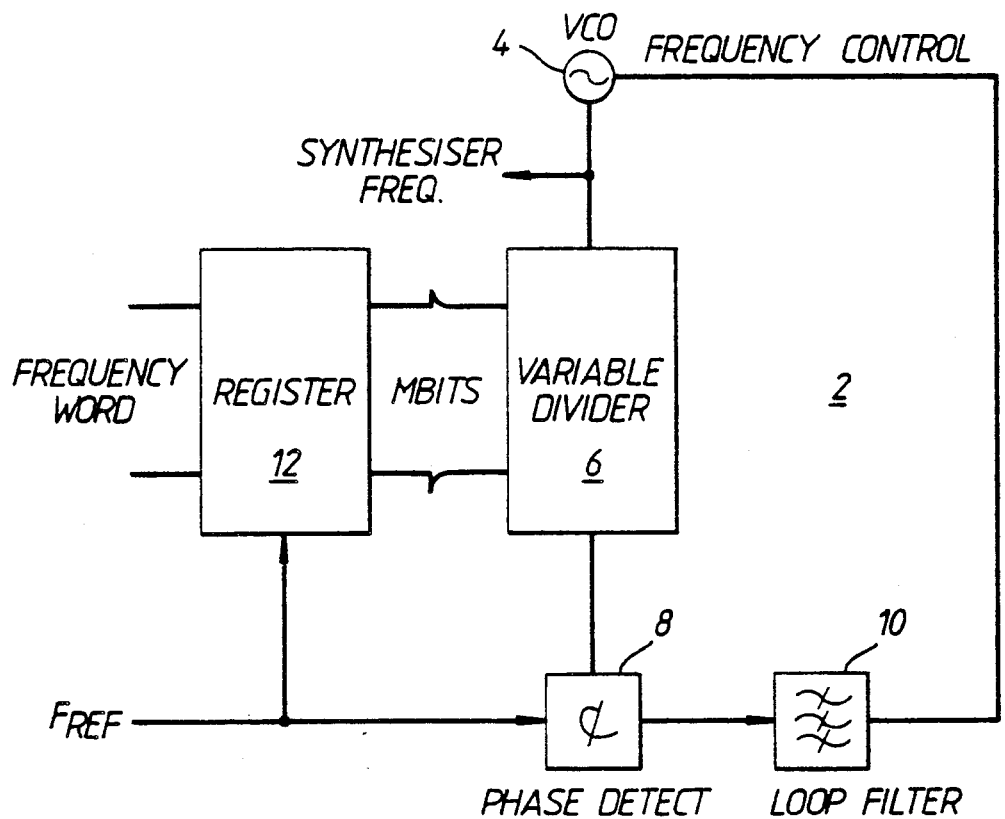
FIG. 1 is a block diagram of a known phase locked loop.
Figure 2:
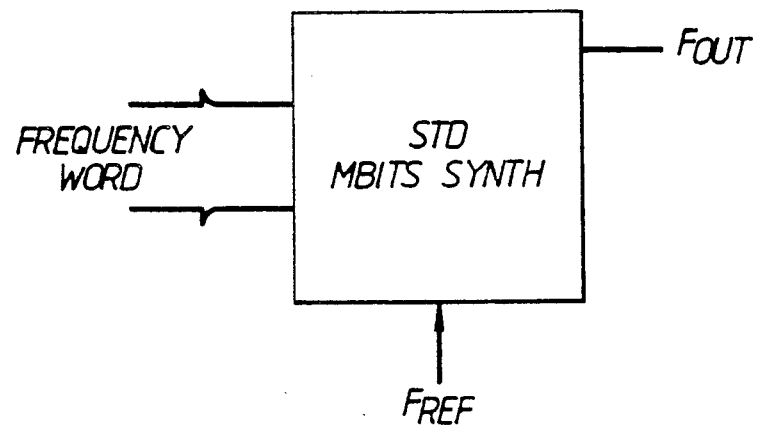
FIG. 2 is a schematic form of the diagram of FIG. 1.
Figure 3:
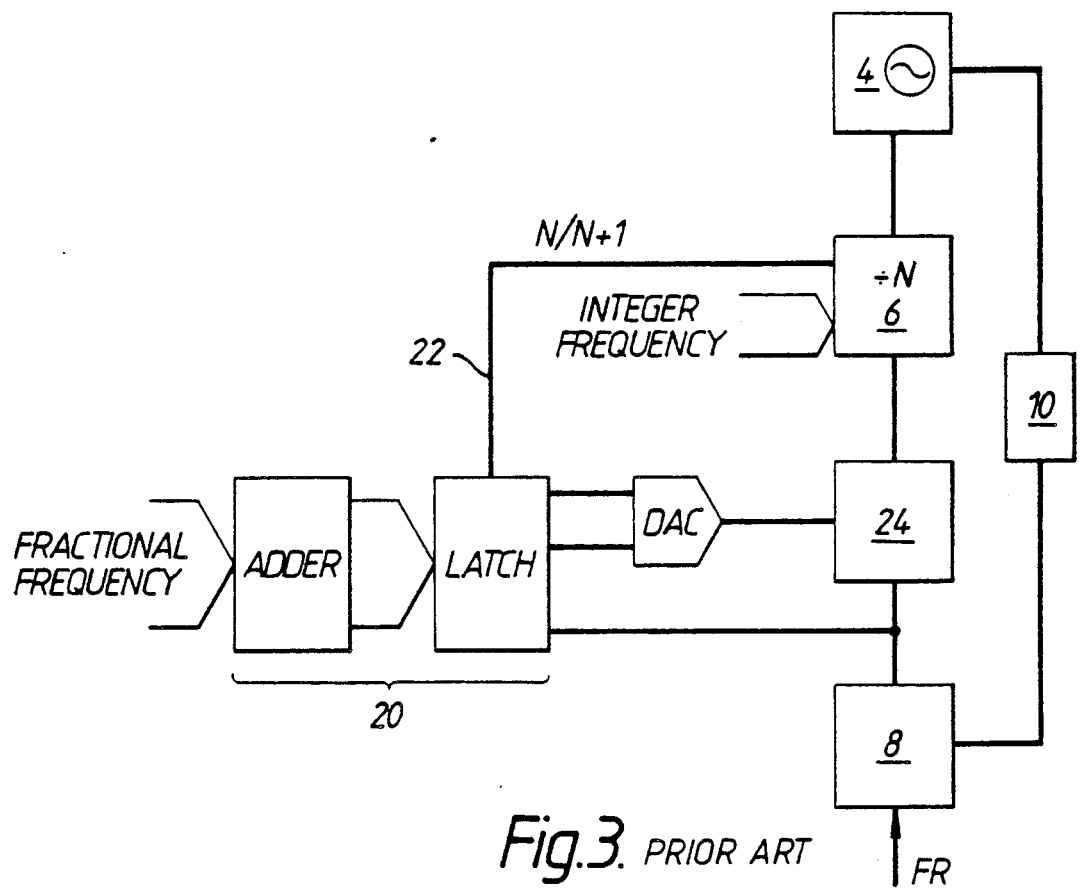
FIG. 3 is a block diagram of a known form of fractional-N synthesiser.
Figure 6:
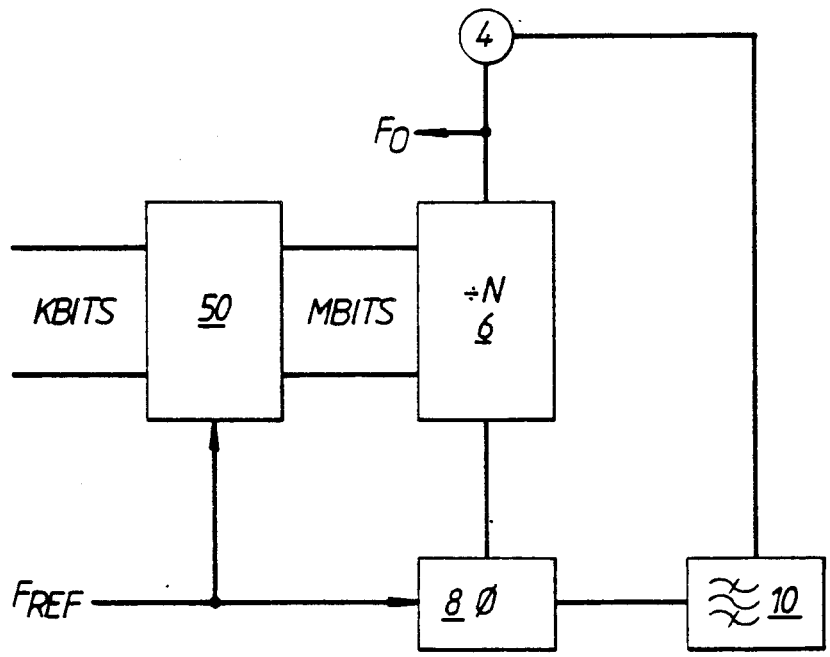
FIG. 6 is a block diagram of a fractional-N synthesiser in accordance with the invention; and, FIGS. 7, 8 and 9 are circuit diagram of interpolators or coders employed in embodiments of the present invention.

Referring now to the preferred embodiment of the invention shown in FIG. 6 of the drawings, similar parts to those shown in FIG. 1 of the drawings are indicated by the same reference numerals.

In accordance with the invention, register 12 is replaced by an interpolator or coder 50 which receives a K-bit frequency word.

The coder or interpolator 50 operates in a limit cycle mode of operation to produce an output of variable frequency and variable mark/ratio in dependence on the value of the input signal to interpolator 50. The output signal from the interpolator 50 is supplied as an M-bit word to variable divider 6.

In operation, the action of interpolator 50 is to produce a M-bit word whose value varies periodically in such a manner that the perturbation signals produced by the phase detector 8 at its output extend into high frequency regions wherein the perturbations have no significant effect on the operation of the phase locked loop. It will be noted that the interpolator arrangement serves as the sole means of reducing phase perturbations in the fractional N synthesiser and that it is not necessary in contrast with the known arrangements described above to introduce an analogue compensation signal either at an input of the phase detector or at the output of the phase detector to compensate for the periodically varying value of the variable divider.

Figure 7:
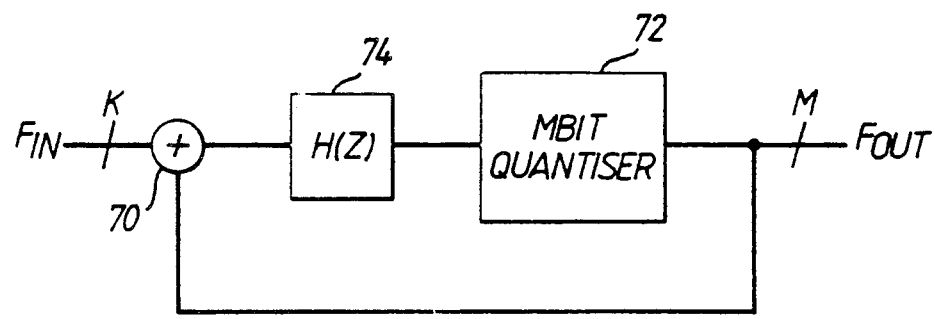
Figure 8:
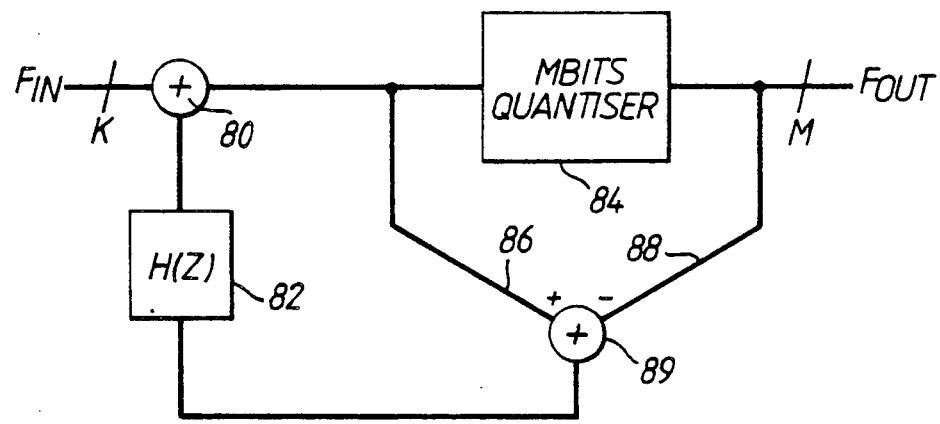
Figure 9:
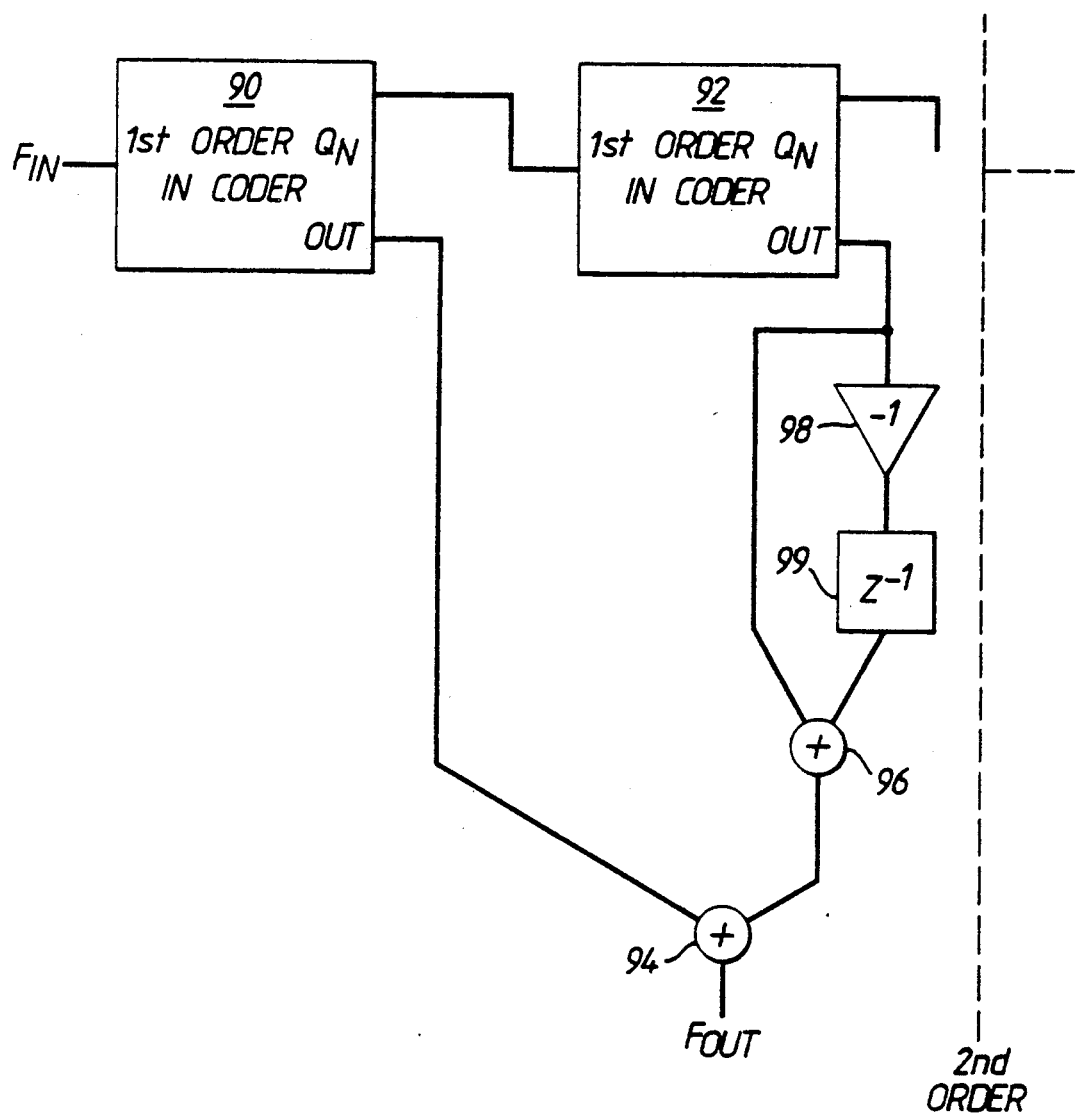

Referring now to FIGS. 7, 8 and 9, FIG. 7 shows a first implementation of an interpolator arrangement, wherein a K bit word is fed to a combiner 70, where it is combined with an M bit word fed back from the output of a digital slicer comprising an M bit quantiser 72. The output of combiner 70 is fed via a feed forward filter 74 to quantiser 72.

$$F_{OUT} = F_{IN} \frac{H(Z)}{1 - H(Z)} + \frac{Q_N}{1 - H(Z)}$$

Here $Q_n$ is the quantisation noise. If for example $$H(Z) = \frac{1}{(1 \ Z^{-1})}$$

then
$$F_{OUT} = -ZF_{IN} + Q_N(2-1)$$

$$|F_{OUT}|^2 = |F_{IN}|^2 + Q_N^2 2(1 - \cos \omega \tau)$$

In accordance with the present invention a fractional 'N' synthesiser is provided including a coder for converting a K bit input word to an M bit word, where K > M, for application to a variable divider, wherein the coder comprises a noise shaping coder including an M bit quantiser and means for feeding back a quantisation noise signal (Q) from the quantiser, via a filter means (H), for combining with the input signal, so as to provide an output signal $F_{OUT}(M) = F_{IN}(K) + Q.f$ (II).

An advantage of the present invention is that it reduces unwanted "ripple" side bands caused by variation of the M bit word to the variable divider of the frequency synthesiser, since a noise shaping coder tends to reduce the variation of the M bit output word.

A first order implementation of a noise feedback coder is shown in FIG. 8, wherein a K bit word in applied to a combiner 80, where it is combined with a feed back signal from a filter unit 82, the output from combiner 80 being applied to an M Bit quantiser 84, the quantisation error being derived from a feed forward line 86, a feedback line 88 and subtractor 89, being applied to filter 82.

Here $F_{OUT} = F_{IN} + Q_N(1 - H(Z))$ or for $$H(Z) = \frac{1}{(1 - Z^{-1})}$$

$$F_{OUT} = F_{IN} + Q_N \frac{(Z - 1)}{Z}$$

or $|F_{OUT}|^2 = |F_{IN}|^2 + Q_N 2 (1 - \cos\omega\tau)$

This is identical to the $\Sigma$DPCM case.

A second order implementation of a noise feedback coder is shown in FIG. 9 wherein units 90, 92 each comprises a 1st order $Q_N$ in coder. The units 90, 92 are connected in cascade via their $Q_N$ outputs. The output of the coders are connected as shown by summer units 94, 96, delay unit 99 and inverter 98.

The order of the noise feedback systems can be increased beyond the first order examples given by modification of the factor H(z).

The factor $H_{(Z)}$ can be increased to any desired order of Z and it will be apparent to a person skilled in the art how this can be done.

Alternatively a series of first order coders with a provision of a $Q_N$ Output could be combined to produce a high order system.

In the circuit of FIG. 9, $|F_{OUT}|^2 = |F_{IN}|^2 + Q_N|(Z-1)^2|$ It is recognized that "dither" inserted into any quantiser can decorrelate the quantisation noise $Q_N$ and provide significant benefits. Although not specifically illustrated dither can be used in these coder schemes.

All forms of 'coder' will produce repetitive patterns which can be stored in a RAM of appropriate size prior to delivery to the synthesiser frequency control input. This buffer could enable a non-real time generation of the pattern using algorithms deduced from the block diagrams by a "low speed" microprocessor. This indirect method of generation may be attractive for certain applications where the frequency data is changed infrequently.

I claim:

1. A fractional-N synthesizer including a phase locked loop comprising:
   a voltage controlled oscillator providing a loop output signal, the output signal being coupled by way of a divide by N variable divider to a first input of a phase detector;
   a reference frequency source coupled to a second input of the phase detector, the detector providing at an output a control signal, in dependence upon a comparison between the signals applied to the first and second inputs, for application to a control input of the voltage controlled oscillator; and
   means for setting the division ratio N of the variable divider, in response to a frequency data word, including interpolator means for periodically varying at least the least significant bit of the frequency data word, the interpolator means comprising an input for receiving an input data word, a combiner means for combining the input data word with a feedback signal, a quantiser circuit, means for connecting an output of said combining means to said quantiser circuit, a filter circuit providing a predetermined integration function, means connecting said filter circuit to receive a quantisation error signal from the quantiser, and means connecting the output of the filter circuit as the feedback signal to said combiner means, said frequency data word being derived from an output of the quantiser circuit.

2. A synthesizer as claimed in claim 1 comprising means to receive signals from the input and output of the quantiser circuit and to generate said quantisation error signal from the difference between said input and output signals.

3. A synthesiser as claimed in claim 1 wherein the interpolator is operative to receive a K bit word and produce an M bit word for application to a control input of the variable divider, where the value of M periodically varies and $K > M$.

4. A synthesiser as claimed in claim 1 wherein the quantiser circuit is an M-bit quantiser.

5. A synthesiser as claimed in claim 1 wherein the interpolator arrangement comprises a plurality of coders connected in cascade; and having their outputs coupled to provide a common output.

6. A synthesiser circuit as claimed in claim 5 wherein the order of the coder is determined by the number of coders connected in cascade.

7. A synthesiser as claimed in claim 1 wherein the interpolator arrangement comprises an $n^{th}$ order coder, where $n = 1, 2, 3$ or higher integer.

8. A synthesizer circuit as claimed in claim 7 wherein the order of the coder is determined by the number of coders connected in cascade.

9. A synthesiser circuit as claimed in claim 1 wherein the order of the coder is determined by the transfer function H(z) of the filter circuit.

10. A synthesiser circuit as claimed in claim 1 wherein the ratio setting signal is applied to a memory store prior to application to said variable divider

* * * * *